United States Patent
Peterson et al.

(10) Patent No.: US 8,488,323 B2
(45) Date of Patent: Jul. 16, 2013

(54) CONTROLLING MINIMUM AIR INLET TEMPERATURE USING WASTE HEAT

(75) Inventors: Eric C. Peterson, Woodinville, WA (US); Christian L. Belady, Mercer Island, WA (US)

(73) Assignee: Microsoft Corporation, Redmond, WA (US)

(*) Notice: Subject to any disclaimer, the term of this patent is extended or adjusted under 35 U.S.C. 154(b) by 294 days.

(21) Appl. No.: 12/959,380

(22) Filed: Dec. 3, 2010

(65) Prior Publication Data

US 2012/0140404 A1    Jun. 7, 2012

(51) Int. Cl.
*H05K 7/20* (2006.01)
*F28D 15/00* (2006.01)
*H01L 23/34* (2006.01)
*H01B 7/42* (2006.01)

(52) U.S. Cl.
USPC ............... 361/700; 361/679.52; 165/80.4; 165/80.5; 165/104.33; 257/715; 174/15.2

(58) Field of Classification Search
USPC .......... 361/699–702, 679.47, 679.52–679.53; 165/80.4–80.5, 104.33; 257/714–716; 174/15.1–15.2
See application file for complete search history.

(56) References Cited

U.S. PATENT DOCUMENTS

| 3,618,854 | A | * | 11/1971 | Frank ................... 237/12.3 B |
| 3,788,388 | A | | 1/1974 | Barkmann |
| 4,768,484 | A | | 9/1988 | Scarselletta |
| 5,195,575 | A | | 3/1993 | Wylie |
| 6,209,626 | B1 | | 4/2001 | Bhatia |
| 6,460,353 | B2 | | 10/2002 | Udobot et al. |
| 6,519,955 | B2 | | 2/2003 | Marsala |
| 7,068,509 | B2 | * | 6/2006 | Bash et al. .............. 361/700 |
| 7,581,378 | B2 | | 9/2009 | Brand et al. |
| 2008/0174962 | A1 | | 7/2008 | Belady et al. |
| 2009/0090113 | A1 | * | 4/2009 | Caillat ..................... 62/56 |

OTHER PUBLICATIONS

Firouzfar, et al., "A Review of Heat Pipe Heat Exchangers Activity in Asia", Retrieved at <<http://www.waset.org/journals/waset/v47/v47-5.pdf>>, World Academy of Science, Engineering and Technology 47 2008, pp. 22-27.

* cited by examiner

*Primary Examiner* — Zachary M Pape
(74) *Attorney, Agent, or Firm* — Westman, Champlin & Kelly, P.A.

(57) ABSTRACT

An electronic device has a ventilation system with an inlet section that receives inlet air that travels past components of the computing device to be cooled and exits at an outlet section. The air carries heat away from the components. A liquid heat transfer system captures heat generated by the components and transfers the captured heat to the inlet section of the ventilation system to warm the inlet air before it travels past the components to be cooled.

20 Claims, 12 Drawing Sheets

CONTROLLING MINIMUM AIR INLET TEMPERATURE USING WASTE HEAT

BACKGROUND

Many high performance computing systems have electronic components that generate a great deal of heat during operation. These systems often have a maximum operating temperature. If the temperature of the components of the computing system exceeds the maximum operating temperature, they do not operate reliably.

Therefore, many such systems are cooled using a ventilation system. Some ventilation systems simply allow air to pass over the warm components, so that the heat dissipates in the air. Other ventilation systems are forced air systems in which a fan is used to actively move air across (or past) the electronic components that are to be cooled. The air absorbs heat generated by those components and transfers it, under the influence of the fan, away from the components, to cool them. Other cooling systems are used as well, such as liquid cooling systems.

Many high performance computer systems also have a minimum operating temperature. If the temperature of the components of the computing system drops below the minimum operating temperature, they do not operate reliably either. Therefore, if the inlet air used to cool the computing system is below the minimum temperature, then the computing system may not operate reliably.

Some computing systems use free air cooling in which the cooling air is drawn from outside the enclosure, building or facility where the computer system is deployed. Depending on the geographic region where the computer system is deployed, this inlet air may be well below the minimum air temperature for reliable operation. Therefore, some current systems heat the inlet air before it is introduced into the computer system.

One current system for preheating the inlet air uses exhaust air from the computing system. The exhaust air is re-circulated back to the inlet section and mixed with the fresh, ambient air drawn into the inlet section for cooling. This is done in an attempt to have the warmer exhaust air mix with the cooler ambient air, in order to preheat the ambient air before it is used for cooling the computer system.

However, this has a number of significant disadvantages. Using this type of pre-heating, it can be difficult to maintain an even temperature distribution across the air inlet. Similarly, mixing of the warmer air with the cooler air can be made even more difficult where the ambient air inlet is a relatively small space or in close proximity to the components being cooled. To obtain adequate mixing, ducting and mixing plenums may also be needed, which requires extra space. This can mean that there needs to be close coordination between information technology and data center personnel. For instance, this type of air mixing can be especially difficult where it is attempted on an individual machine basis, such as where the preheating is attempted for an individual server, or for a small set of servers. It can also be difficult, however, even when it is attempted on a larger scale, such as to preheat air used for cooling a full rack of servers.

The discussion above is merely provided for general background information and is not intended to be used as an aid in determining the scope of the claimed subject matter.

SUMMARY

An electronic device, such as a computing device, is cooled by directing air past one or more components of the device that are to be cooled. The air is directed past those components from an air inlet section to an air outlet section. A liquid heat transfer system is used for capturing heat generated by the components and transferring the captured heat to the inlet section to warm the inlet air before it travels past the components to be cooled, or the captured heat is transferred directly to the components that need to be warmed.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

DETAILED DESCRIPTION

Figure 1:
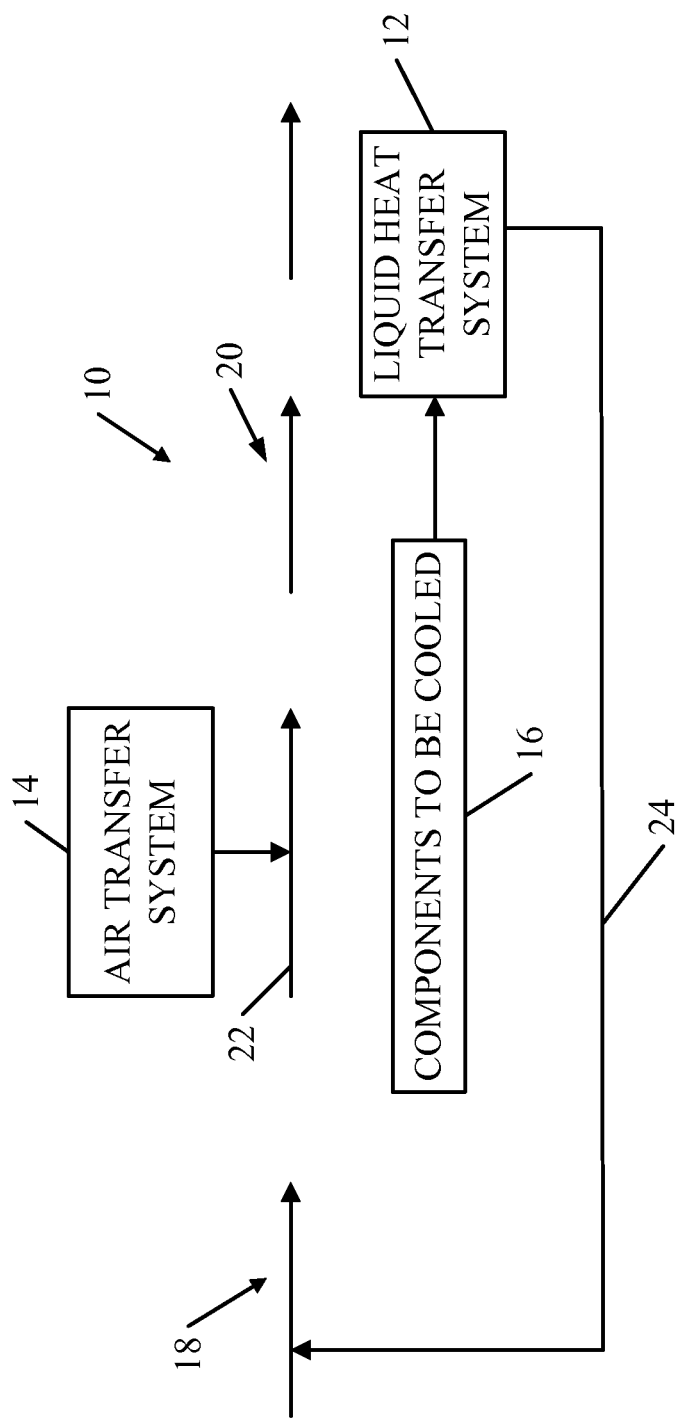
FIG. 1 is a block diagram illustrating one embodiment of a cooling system for cooling components.

FIG. 1 is a block diagram of a system 10 showing a liquid heat transfer system 12 deployed, along with an air transfer system 14, to cool computer components 16. Before describing system 10 in more detail, a brief discussion will be provided to facilitate a better understanding of what is meant by liquid heat transfer system.

Liquid heat transfer systems include heat transfer systems that use liquid to transfer heat. In some systems, the liquid stays in the liquid phase throughout the entire heat transfer operation. Such systems include, but are not limited to, systems that use active pumps to pump liquid through conduits to capture heat from a component to be cooled and to release heat in an area away from the component to be cooled. However, for purposes of the present specification, liquid heat transfer systems also include multi-phase liquid heat transfer systems where the liquid changes phase during some portion of the heat transfer operation. Such systems can be passive in that they require no electricity to operate, as do pumps. These types of liquid heat transfer systems include, but are not limited to, heat pipes, thermal siphons, and loop heat pipes, by way of example, where pumping of the liquid could be either active or passive. Liquid heat transfer systems, for purposes of this specification, are different from simple ventilation systems that channel air across components to be cooled and duct some of the exhaust air from an outlet end of the ventilation system, back to the inlet end to mix some of the exhaust air with the inlet air to preheat the inlet air.

Some liquids that can be used include (by way of example only) water, fluorocarbons, alcohol, refrigerant or any of the many other liquids that can be used for heat transfer. The choice of liquids can be based on the particular application, such as whether the system is single phase or two phase, or another application.

Some multi-phase liquid heat transfer systems operate by using an evaporator and a condenser connected by a conduit. The evaporator is placed at the warmer position of the system to be cooled and the condenser is placed at the cooler position. Liquid is provided within a closed conduit connected to the evaporator and the condenser. As the temperature of the component to be cooled increases, the liquid in the evaporator vaporizes into gas. This change of phase from liquid to gas requires heat, which is drawn from the environment of the component to be cooled, either from the exhaust air stream or by being directly coupled to the component. The gas moves along the conduit to the condenser, where it condenses back to liquid. This releases heat, and thereby the heat is effectively transferred from the environment of the component to be cooled, to the environment where the condenser is disposed.

Multi-phase liquid heat transfer systems can enter a condition known as "dry-out". Dry-out occurs when the temperature of the system increases so much that all of the liquid within the system vaporizes into gas. This effectively stops the heat transfer of the mechanisms. Some such mechanisms still transfer a relatively small amount of heat, simply due to the heat conduction of the casing or housing around the system itself. However, this is often less than 1/80th of the original heat conduction when the system is not in the dry-out condition. Therefore, dry-out effectively turns the multi-phase liquid heat transfer system off.

In FIG. 1, components 16 are computing components that are to be cooled. Components 16 may be, by way of example, electronic computing components, entire circuit boards, or individual integrated circuits like processors such as a central processing unit or a graphics processing unit. Components 16 may also be, by way of example, any other components and may be disposed on a structural support such as a circuit board. Some components 16 may be diodes or power supply circuits or other components that are to be cooled in a computing system.

Air transfer system 14 causes air to flow from an air inlet end (relative to components 16) shown generally at 18 to an air outlet end shown generally at 20. The airflow path in FIG. 1 is illustrated by arrows 22. Air transfer system 14 can simply be a ventilation path between openings in a housing that houses components 16, or it can be a ventilation path that includes a fan for actively moving air along air travel path 22. Other air transfer systems 14 can be used as well.

In any case, liquid heat transfer system 12 is disposed to extract heat either from components 16 or from the outlet end 20 of air travel path 22, or from both. Liquid heat transfer system 12 transfers the heat along heat transfer path 24, to a region proximate the inlet end 18 of air travel path 22. The heat is expelled at inlet end 18 to thereby preheat the air before it travels past components 16.

Figure 2:
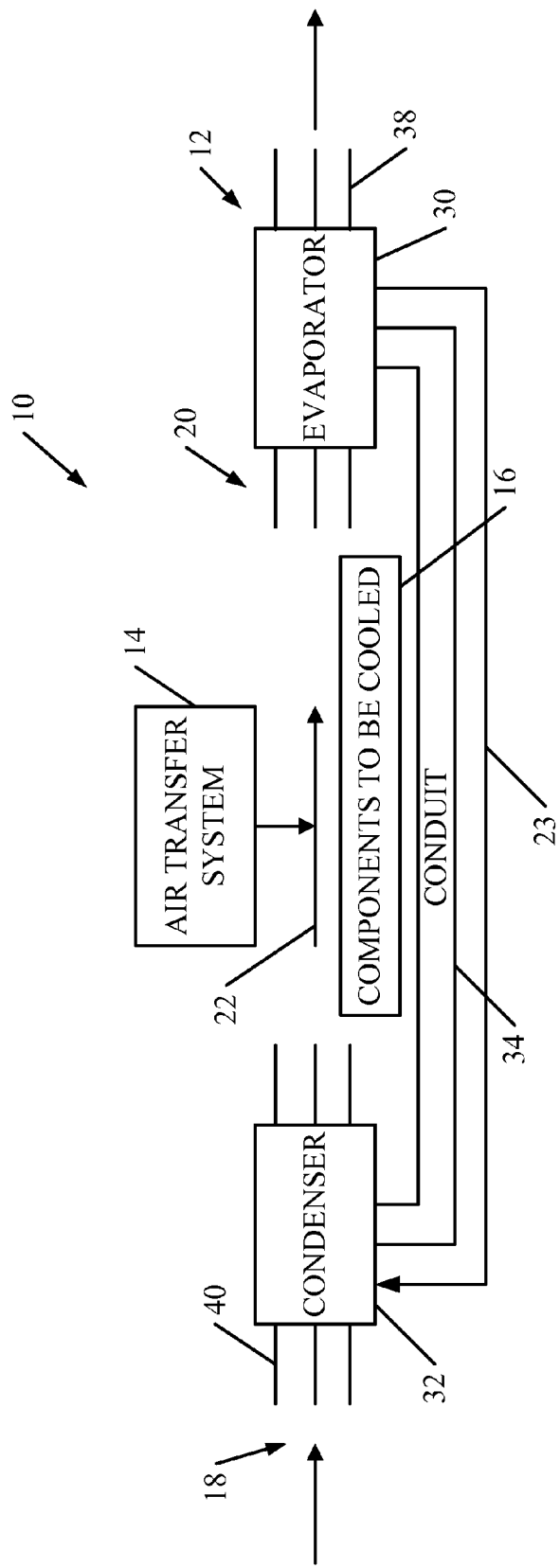
FIG. 2 is a more detailed block diagram showing one embodiment of a cooling system that includes a multi-phase liquid heat transfer system.

FIG. 2 shows a more detailed embodiment of system 10 shown in FIG. 1. In FIG. 2, similar items are numbered similarly to those shown in FIG. 1. However, liquid heat transfer system 12 is shown in FIG. 2 as a multi-phase liquid heat transfer system (such as a heat pipe, a heat siphon, or a loop heat pipe). In any case, heat transfer system 12 (shown in FIG. 2) includes evaporator 30, condenser 32 and conduit 34 that connects evaporator 30 with condenser 32. Of course, it will also be appreciated that the evaporator 30 and condenser 32 can form conduit 34, or part of conduit 34, as well. In the embodiment shown in FIG. 2, both evaporator 30 and condenser 32 are shown with heat exchangers 38 and 40, respectively, disposed thereon. In the embodiment shown in FIG. 2, heat exchangers 38 and 40 take the form of thermally conductive fins which are annularly disposed about evaporator 30 and condenser 32. By increasing the surface area of the heat exchangers 38 and 40, the thermal resistance of the system at those points is reduced, and this facilitates more efficient heat transfer.

In the embodiment shown in FIG. 2, evaporator 30 is shown within the outlet end 20 of air travel path 22. Similarly, condenser 32 is shown in the inlet end 18 of air travel path 22. Therefore, in the embodiment shown in FIG. 2, evaporator 30 extracts heat from the exhaust air and transfers it back, along heat transfer path 23, to the inlet end 18 where it is released by condenser 32 to preheat the inlet air.

Figure 2A:
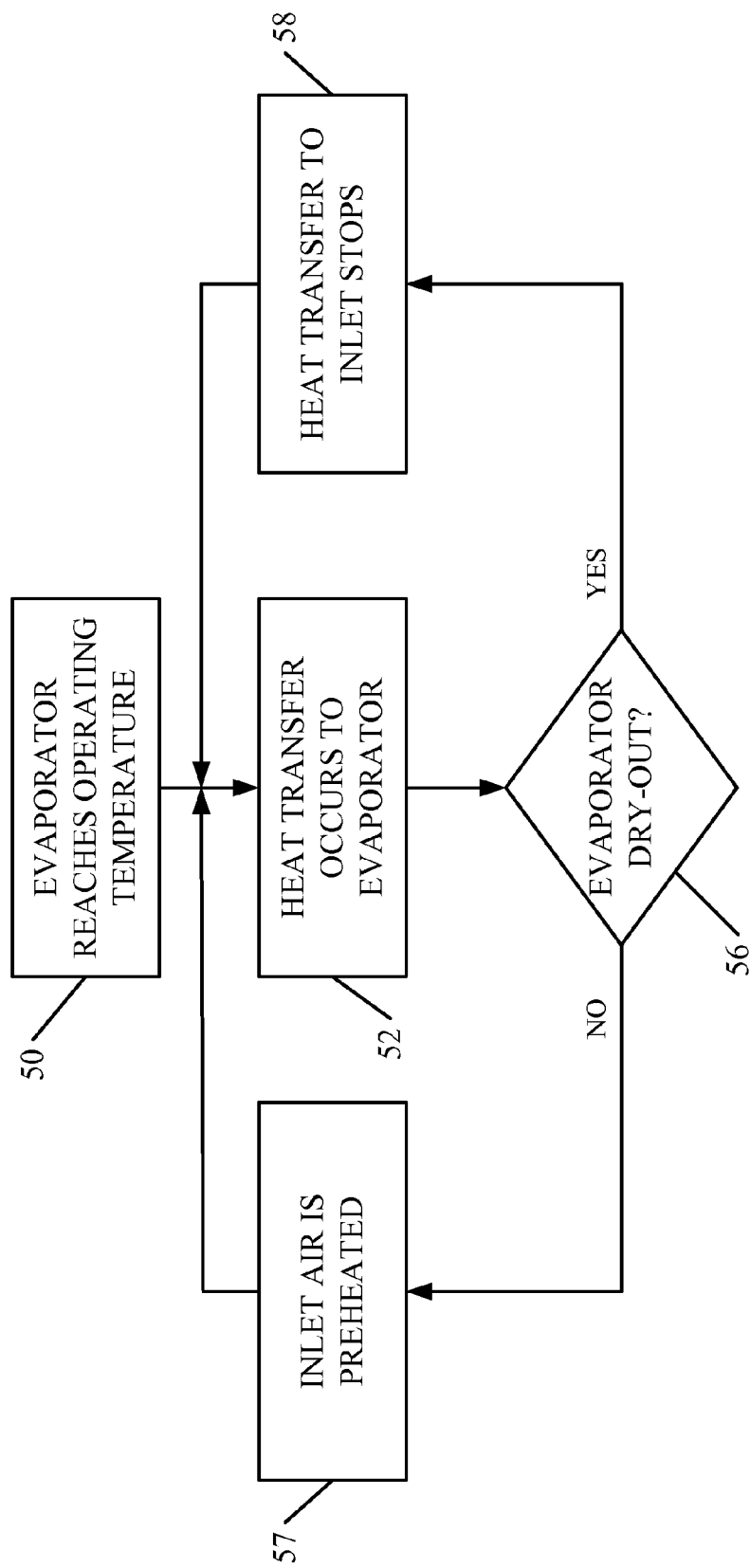
FIG. 2A is a flow diagram illustrating the operation of a liquid heat transfer system in accordance with one embodiment.

Operation of the system shown in FIG. 2 is generally illustrated by FIG. 2A. As the components 16 are operating, their temperature increases. Evaporator 30 eventually reaches its operating temperature, when heat transfer begins. This is indicated by block 50 in FIG. 2A. Heat transfer to the evaporator continues as long as the temperature in the area of the evaporator 30 is above the temperature of the evaporator itself (that is, the evaporator captures heat). That is indicated by block 52 in FIG. 2A. So long as dry-out is not reached (as indicated by block 56) the liquid in evaporator 30 changes to its gas phase and moves into condenser 32, where it changes back to its liquid phase. Because condenser 32 (and optionally heat exchanger 40) release heat at the inlet end 18 of air travel path 22, the inlet air is preheated. This is indicated by block 57 in FIG. 2A.

As the temperature of the components 16 increases, heat transfer to evaporator 30 continues and the temperature of evaporator 30 continues to increase as well. This causes more of the liquid in evaporator 30 to change to gas. As more liquid changes to gas, the line between the gas and the liquid evaporator 30 migrates in a direction toward condenser 32. Eventually, if the temperature of components 16 gets high enough, the temperature of evaporator 30 reaches the temperature at which system 12 enters dry-out. That is, all the liquid in evaporator 30 changes to gas so the line between gas and liquid migrates outside of evaporator 30. Assuming the thermal conductive properties of conduit 34 make conduit 34 a poor thermal conductor, then dry-out occurs (as indicated by block 56 in FIG. 2A), and heat transfer from evaporator 30 to condenser 32 essentially stops (as indicated by block 58 in FIG. 2A). The physical characteristics of system 12 determine, at least in part, the temperature at which dry-out occurs. For instance, the volume of liquid in system 12 can change the temperature at which dry-out occurs. Because the change from the liquid phase to the gas phase increases the pressure within system 12, as more liquid changes to gas, more heat is required to continue the process of vaporizing the liquid. Therefore, if system 12 has a relatively large amount of liquid, dry-out will occur at a relatively higher temperature. By contrast, if system 12 has a relatively smaller amount of liquid, dry-out will occur at a relatively lower temperature. The type of liquid in system 12 also affects the temperature at which dry-out occurs. If the liquid vaporizes at a relatively lower temperature, then dry-out will occur at a relatively lower temperature and vice versa. Similarly, if the evaporator or conduit (or both) has relatively larger dimensions (such as a larger volume) then there is more space which vaporizes the liquid in system 12, and more liquid will be vaporized at a lower temperature. On the other hand, if the physical dimensions of the evaporator or conduit (or both) are relatively smaller (such as that it has a smaller volume) then less liquid will be vaporized at a given temperature and dry-out occurs at a higher temperature.

In one embodiment, the physical characteristics of system 12 (such as, by way of example only, its size, the type of liquid used, or the volume of liquid used) that influence the temperature at which dry-out occurs are chosen so that dry-out occurs at a predefined temperature or within a predefined temperature range. For instance, the inlet air only needs to be preheated until components 16 are within a desired operating range. As the components 16 continue to heat up, it may no longer become desired to continue to heat the inlet air. Therefore, the physical characteristics of system 12 are illustratively chosen so that, as components 16 heat up to be comfortably within their desired operating temperature range, system 12 enters dry-out and heat transfer to the inlet is discontinued. This is indicated by blocks 56 and 58 in FIG. 2A If, on the other hand, the temperature of components 16 begins to drop, then the temperature of evaporator 30 will drop as well, and the line between the gas and the liquid in system 12 will migrate back within evaporator 30 brining system 12 out of the dry-out condition. When that happens, heat transfer back to the inlet, to preheat the inlet air, will again continue. This is indicated by block 57. Thus, in one embodiment, system 12 is designed so that it uses the dry-out condition as a mechanism for controlling heat transfer to preheat the inlet air to keep components 16 in their desired operating range.

In one embodiment, system 12 is also designed so that the rate at which it enters dry-out is controlled as well. That is, if system 12 is designed in one way, once it reaches its dry-out temperature, it can enter dry-out relatively quickly, almost approaching a step function from the nondry-out condition to the dry-out condition, and vice versa. On the other hand, if system 12 is designed in another way, as it approaches its dry-out temperature, heat transfer within system 12 can slowly begin to drop off, until full dry-out is reached at which point heat transfer essentially stops. This is indicated by FIG. 2B.

Figure 2B:
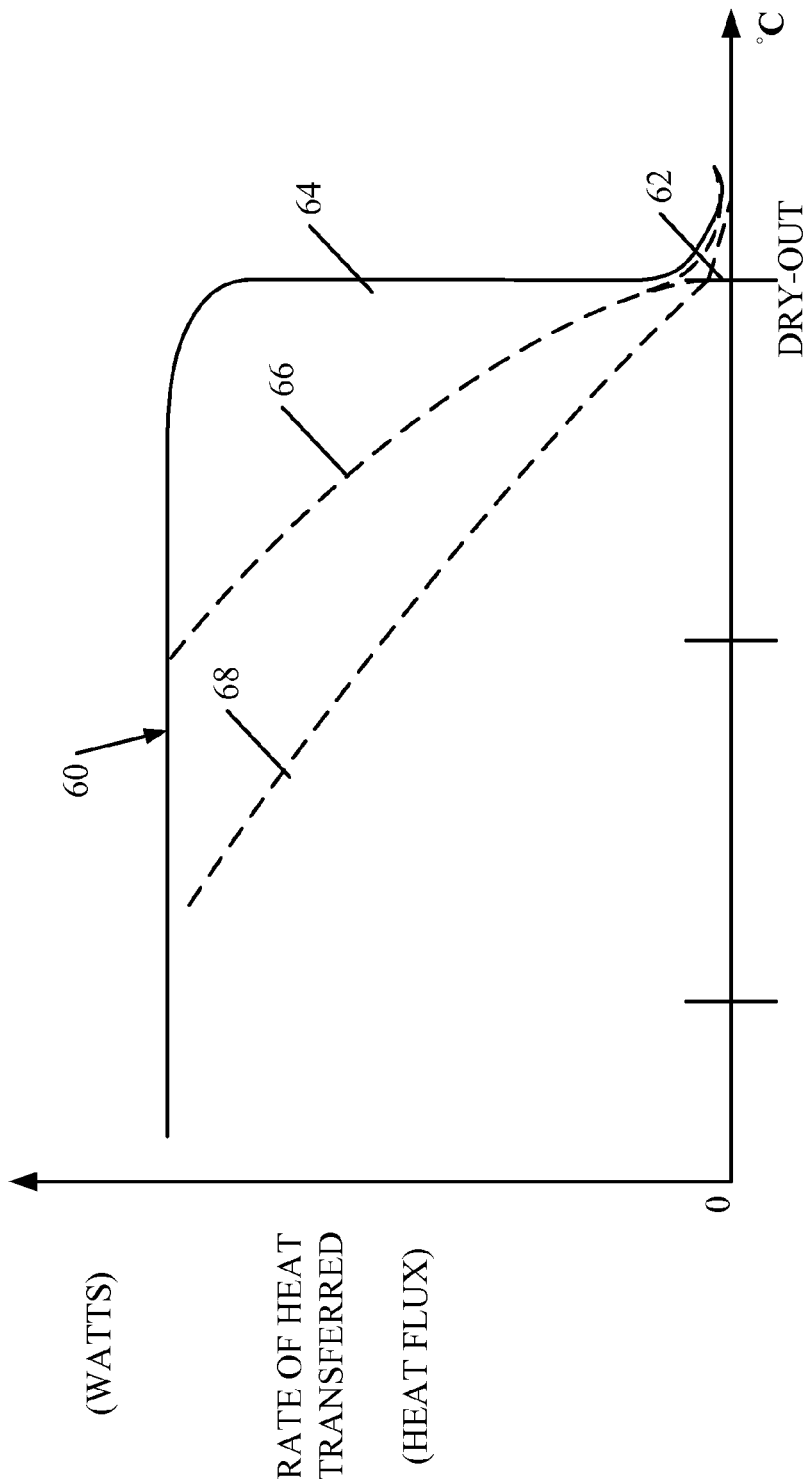
FIG. 2B is a graph illustrating different exemplary ways of controlling heat transfer in the liquid heat transfer system.

FIG. 2B shows a graph with temperature in degrees Celsius along the horizontal axis and heat transfer in watts along the vertical axis. During normal operation, system 12 is transferring heat at a rate indicated in the general region shown at 60 in FIG. 2B. However, as the temperature of system 12 approaches dry-out temperature 62, the rate of heat transfer reduces to basically zero (or approaches zero). System 12 can be designed so that this occurs substantially along a step function illustrated at 64, or more gradually as illustrated by dashed lines 66 and 68.

For instance, the design of evaporator 30 can determine how quickly system 12 will enter dry-out, as it approaches the dry-out temperature. If the evaporator is designed to be more of a large conductive block, then even as the line between gas and liquid migrates through evaporator 30 toward conduit 34, evaporator 30 continues to vaporize the liquid at substantially a constant rate. Thus, the system also transfers heat at substantiveally a constant rate. Then, once the line between the gas and the liquid migrates out of evaporator 30, heat transfer stops. Thus, the rate at which system 12 will move between a fully operational condition and a full dry-out condition will be quite rapid, following more of a step function.

However, design of evaporator 30 can also be varied so the rate at which system 12 will move between a fully operational condition (associated with number 60 on the graph of FIG. 2B) and a full dry-out condition (associated with number 62 in FIG. 2B) will be more gradual. For instance, evaporator 30 can be formed of annularly disposed, thermally conductive fins that are thermally isolated from one another. In that case, as the line between gas and liquid in evaporator 30 migrates past a given fin, the evaporative power associated with that fin is lost, and heat transfer is reduced. This continues as the line between gas and liquid migrates past each successive fin on evaporator 30 so that heat transfer is gradually reduced until the line migrates past the last fin in evaporator 30, at which point heat transfer turns off. Thus, if in a given application, it is desired for the system to transfer from a full heat transfer operating condition to a full dry-out condition more gradually, then the evaporator 30 can be designed in this way. However, if, in a given application, it is desired that the system transfer from a full heat transfer condition, to a full dry-out condition rapidly, then the evaporator 30 can be designated to be more of a block. These same types of conditions can be achieved by varying other physical dimensions of the evaporator 30, condenser 32, heat exchangers 38 and 40, conduit 34, and other physical dimensions of system 12.

Figure 3:
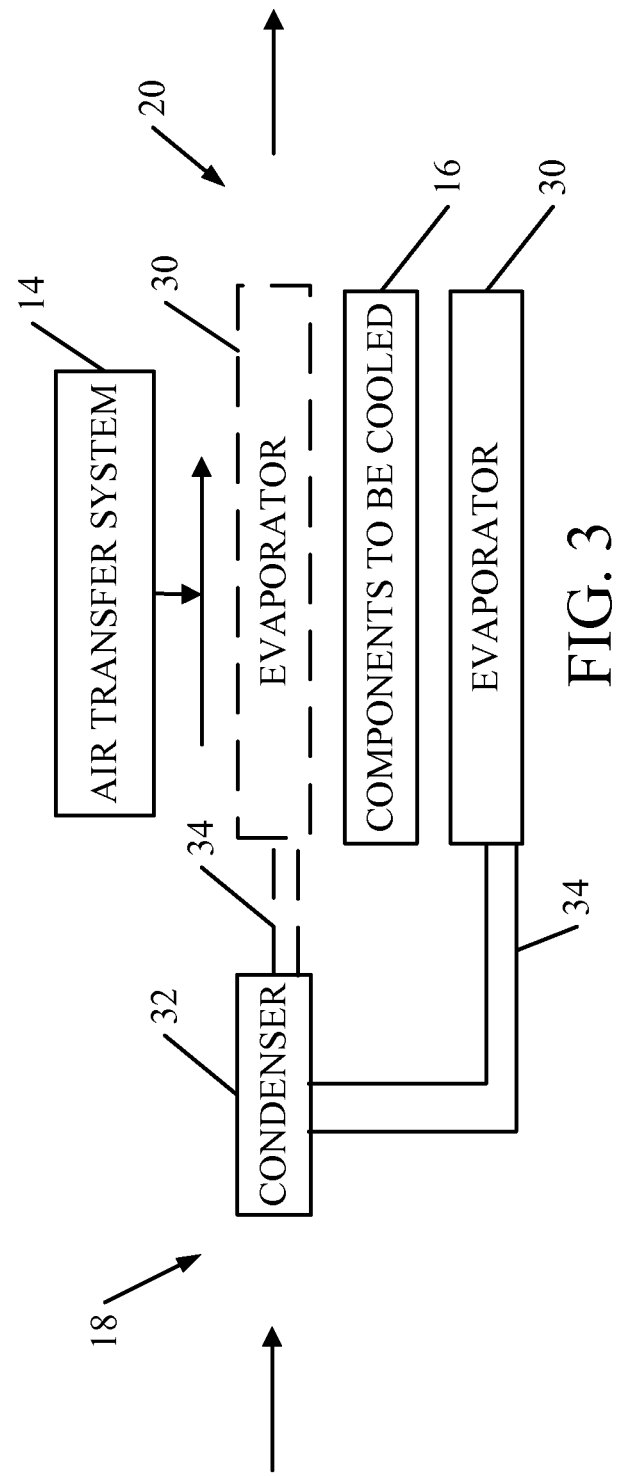
FIG. 3 is a block diagram showing the system of FIG. 2, with the evaporator placed in a different position.

FIG. 3 shows another embodiment in which similar items are similarly numbered to those shown in FIG. 2. However, FIG. 3 shows that instead of evaporator 30 being located at outlet end 20 along air travel path 22, evaporator 30 is located closely adjacent components 16 to be cooled, but not directly in air travel path 22. In this way, evaporator 30 can still absorb a great deal of heat from components 16, without being located directly in air travel path 22. In the embodiment shown in FIG. 3, evaporator 30 may be in direct physical contact with one or more of components 16, or it may simply be located closely proximate components 16 to achieve desired heat transfer.

FIG. 3 also shows another embodiment in which evaporator 30 is shown in dashed lines. In that embodiment, evaporator 30 is in close physical proximity to one or more of the components 16, but it is also closely proximate air travel path 22. In both embodiments shown in FIG. 3, evaporator 30 operates to extract or absorb at least some of the heat generated by components 16, and transfer that heat back to condenser 32 proximate inlet end 18 in air travel path 22.

Figure 4:
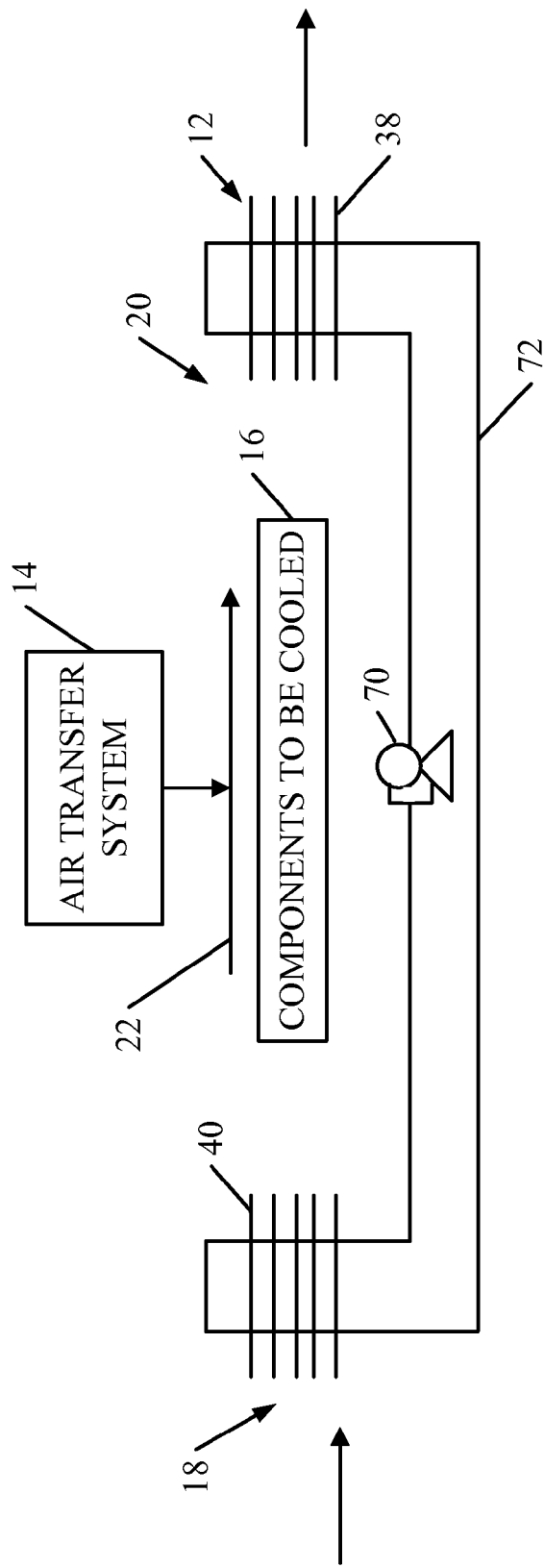
FIG. 4 shows a liquid heat transfer system that includes either a single phase or a multi-phase system and a pump for pumping the liquid.

FIG. 4 shows another embodiment of a liquid heat transfer system 12. In FIG. 4, pump 70 is coupled to conduit 72 that has heat exchangers 38 and 40 disposed thereon. Liquid is pumped by pump 70 through conduit 72 so that it extracts heat generated by components 16 and transfers it back to heat the inlet air received at inlet end 18. In the embodiment shown in FIG. 4, this can be done using a single phase process, in which the liquid remains liquid throughout the entire heat transfer process, or it can be done using a multi-phase process, in which (as with the embodiment shown in FIG. 2) the liquid undergoes a change of phase during the heat transfer process. In either case, heat is transferred from components 16 to preheat the inlet air entering inlet end 18 along air travel path 22. Alternatively, of course, if only a few of components 16 are to be provided with preheated air, then the heat can be transferred either directly to those few components or to an area closely proximate those few components, instead of to the air inlet end 18.

As with the embodiment shown in FIG. 2, the heat transfer can be controlled. For instance, the temperature of the heat extracted by heat exchanger 38 can be measured. This is indicative of the temperature of components 16 to be cooled. As those components are heated to a temperature comfortably within the operating range of components 16, pump 70 can be controlled to pump more slowly, and therefore to transfer heat more slowly to the inlet end 18 for preheating the inlet air. As with the embodiment shown in FIG. 2, heat transfer can be stopped, when desired, simply by turning off pump 70. In that case, very little, if any, heat transfer takes place in the liquid heat transfer system 12 shown in FIG. 4.

Figure 5:
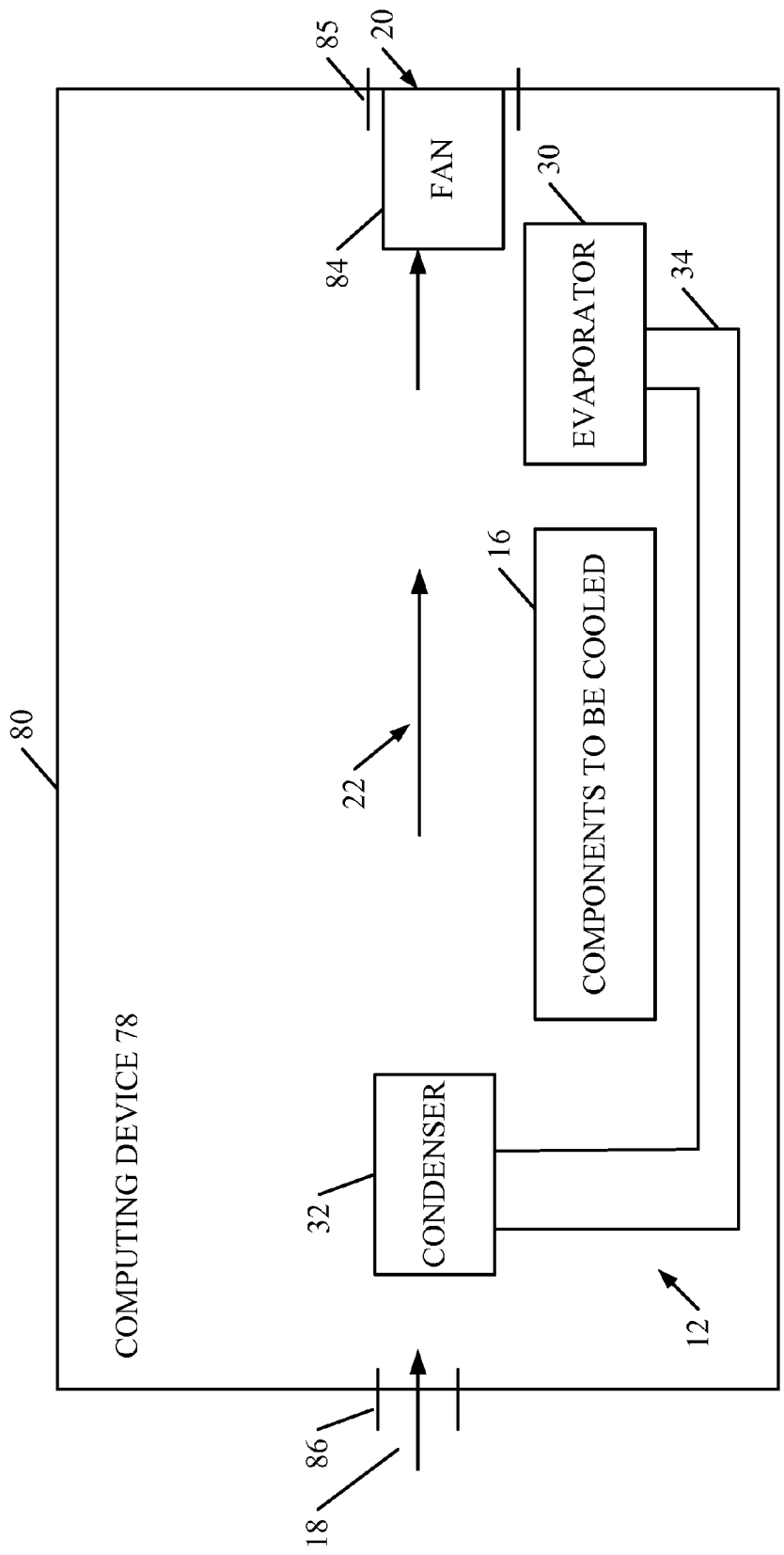
FIG. 5 shows a liquid heat transfer system within a case or housing of a computing device.

FIG. 5 shows an embodiment illustrating one exemplary positioning of the liquid heat transfer system 12. In the embodiment shown in FIG. 5, the liquid heat transfer system 12 is the multi-phase system from FIG. 2. However, it could just as easily be the system shown in FIG. 4. In any case, in FIG. 5, components 16 are part of a computing device 78, such as a server computer, which is located within a structural support such as a case or housing 80.

The air transfer system 14 is implemented in FIG. 5 using fan 84 mounted on housing 80. Fan 84 acts to draw air through an inlet opening 86 in housing 80 (that defines inlet end 18), draw the air along travel path 22, and exhaust the air through an exhaust opening 85 in which fan 84 is mounted (and which defines outlet end 20). In the embodiment shown in FIG. 5, all components of liquid heat transfer system 12 are within case 80. In the embodiment shown in FIG. 5, system 12 can be separately assembled from computing device 78 and fit into case 80 after computing device 78 is manufactured. Of course, system 12 can be manufactured along with computing device 80 as well.

Figure 6:
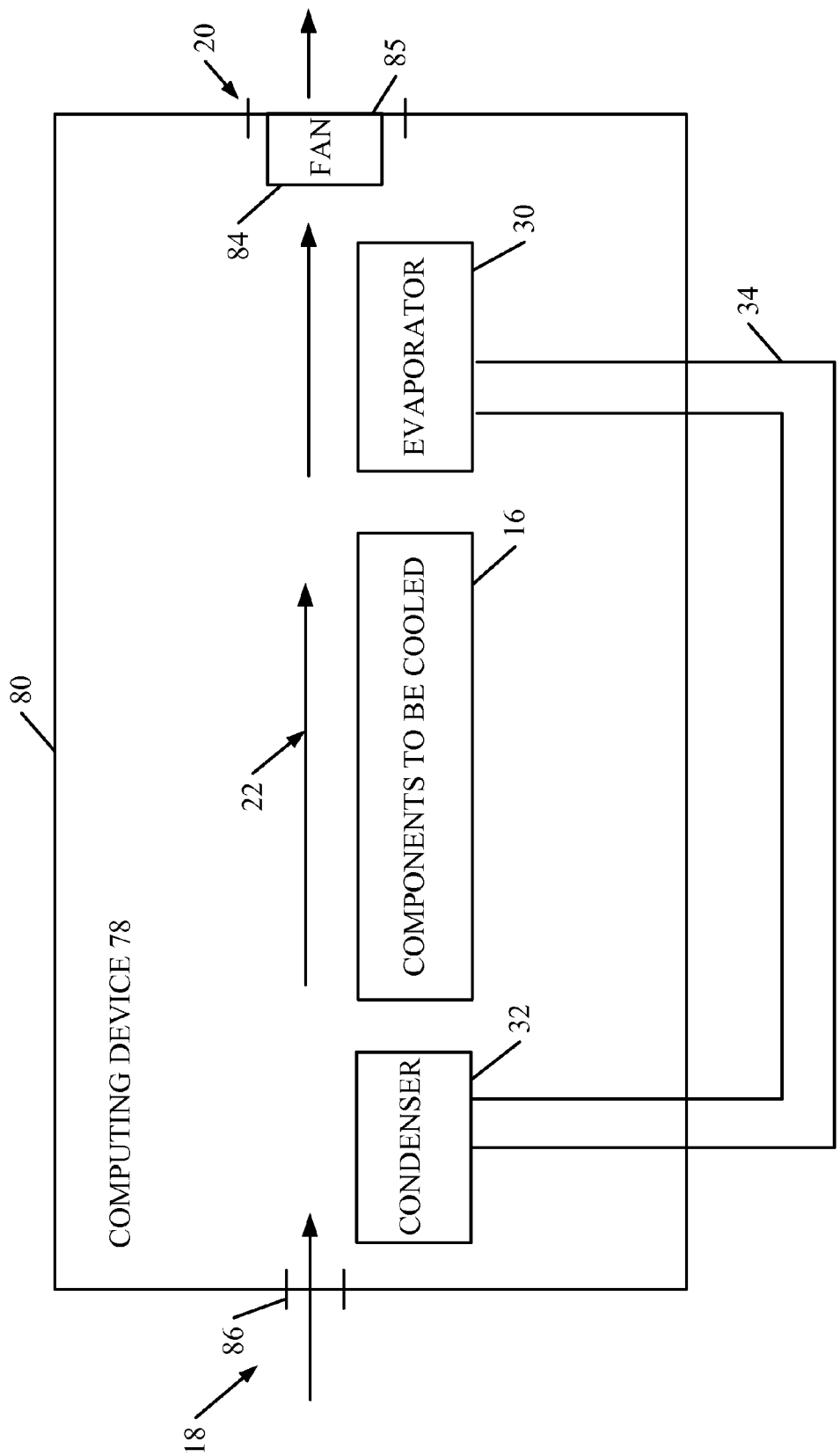
FIG. 6 shows the same features of FIG. 5 except the conduit between the evaporator and the condenser is located outside the case or housing.

Part of the components of the liquid heat transfer system 12 can also be located outside of housing 80. One such illustrative embodiment is shown in FIG. 6. For instance, FIG. 6 shows that while both the evaporator 30 and condenser 32 are within housing 80, the conduit 34 exits the housing near evaporator 30 and re-enters the housing near condenser 32.

Figure 7:
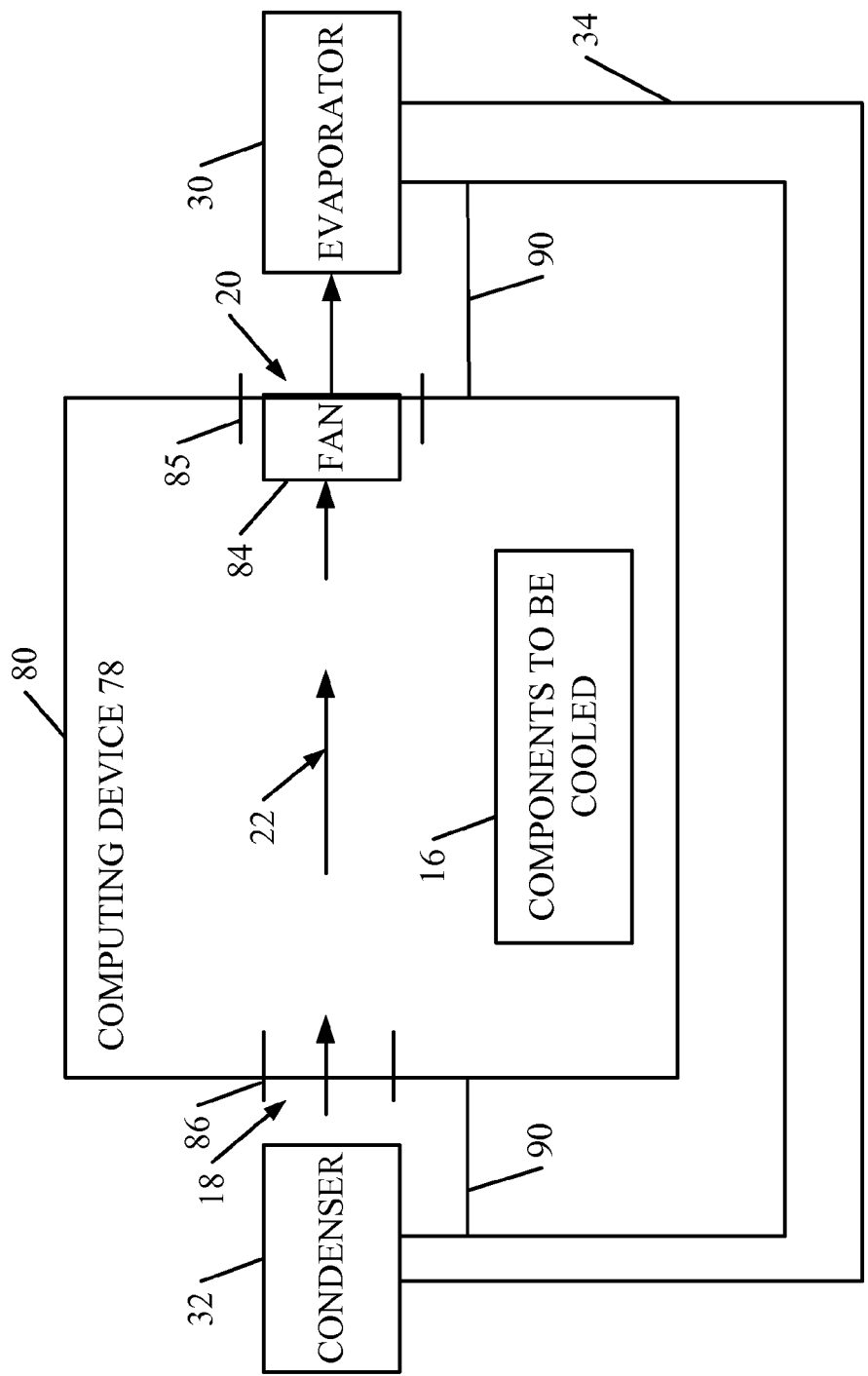
FIG. 7 shows a liquid heat transfer system disposed entirely outside the case or housing for the computer device to be cooled.

FIG. 7 shows yet another embodiment in which the evaporator 30, condenser 32, and conduit 34 are all located outside of housing 80. However, they are fastened to housing 80 using any desired type of mechanical fastening mechanism 90. In one embodiment, mechanical fastening mechanism 90 is insulative so that little or no heat is transferred to or from housing 80. Evaporator 30 is shown outside exhaust opening 85 so that the air expelled by fan 84 impinges on the evaporator 30. In this way, the heat transfer system transfers heat absorbed from the exhaust air back to a position closely proximate the inlet end 18 defined by inlet opening 86 in housing 80 to preheat the inlet air.

Figure 8:
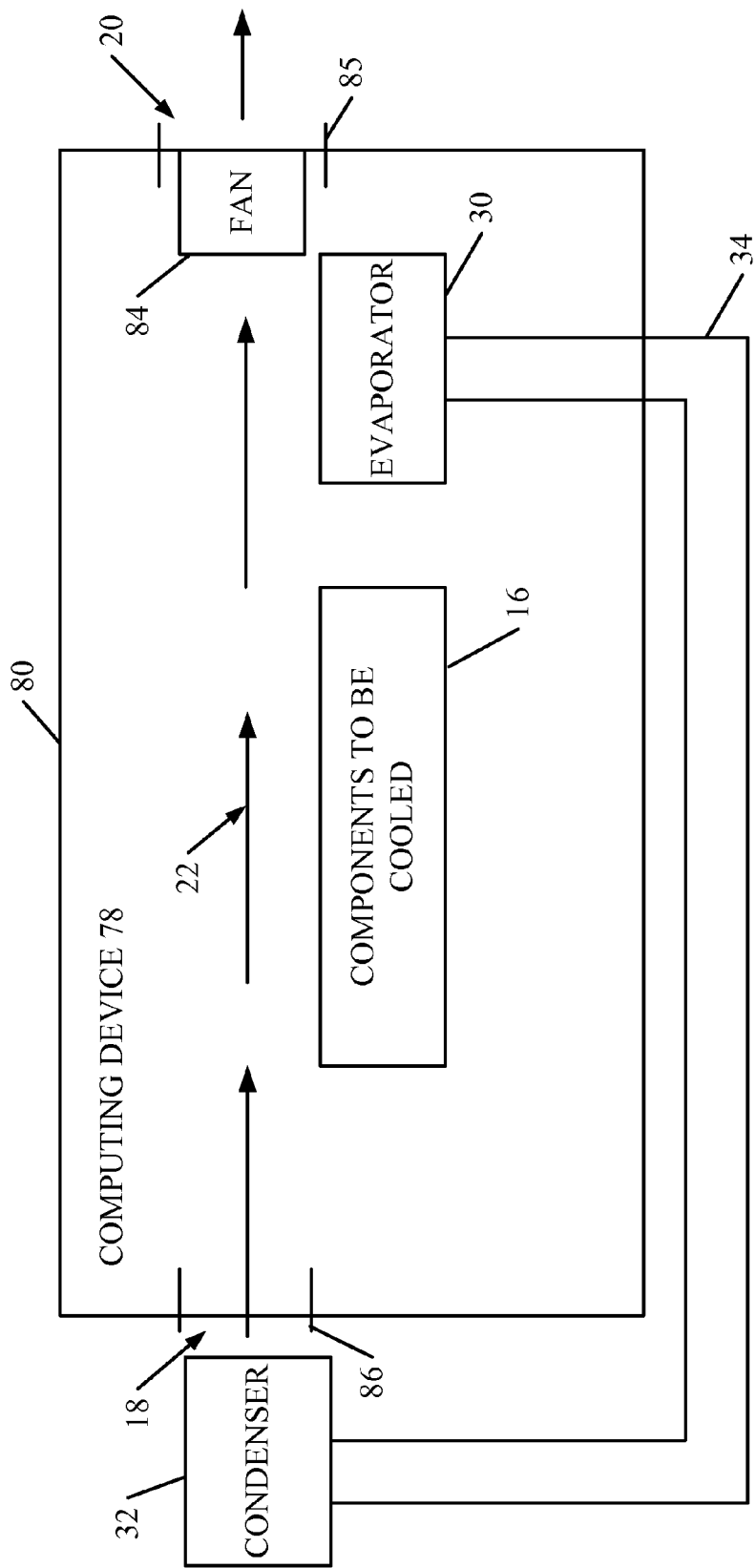
FIG. 8 shows an embodiment in which a portion of the liquid heat transfer system is disposed within the case and a portion is disposed outside the case.

FIG. 8 shows yet another embodiment. In the embodiment shown in FIG. 8, evaporator 30 is located within case 80, and closely proximate components 16 that are to be cooled. However, conduit 34 and condenser 32 are both located outside of housing 80. While a plurality of different combinations are shown for the placement of the components of system 12 implemented as the multi-phase system discussed in conjunction with FIG. 2, the same placement could be achieved for the system shown in FIG. 4. Similarly, other placements of the components could be used as well, so long as waste heat is extracted from components 16 and transferred back to preheat the inlet air, or transferred to a desired group of components 16 that are to be kept at a given temperature or in a given temperature range.

Figure 9:
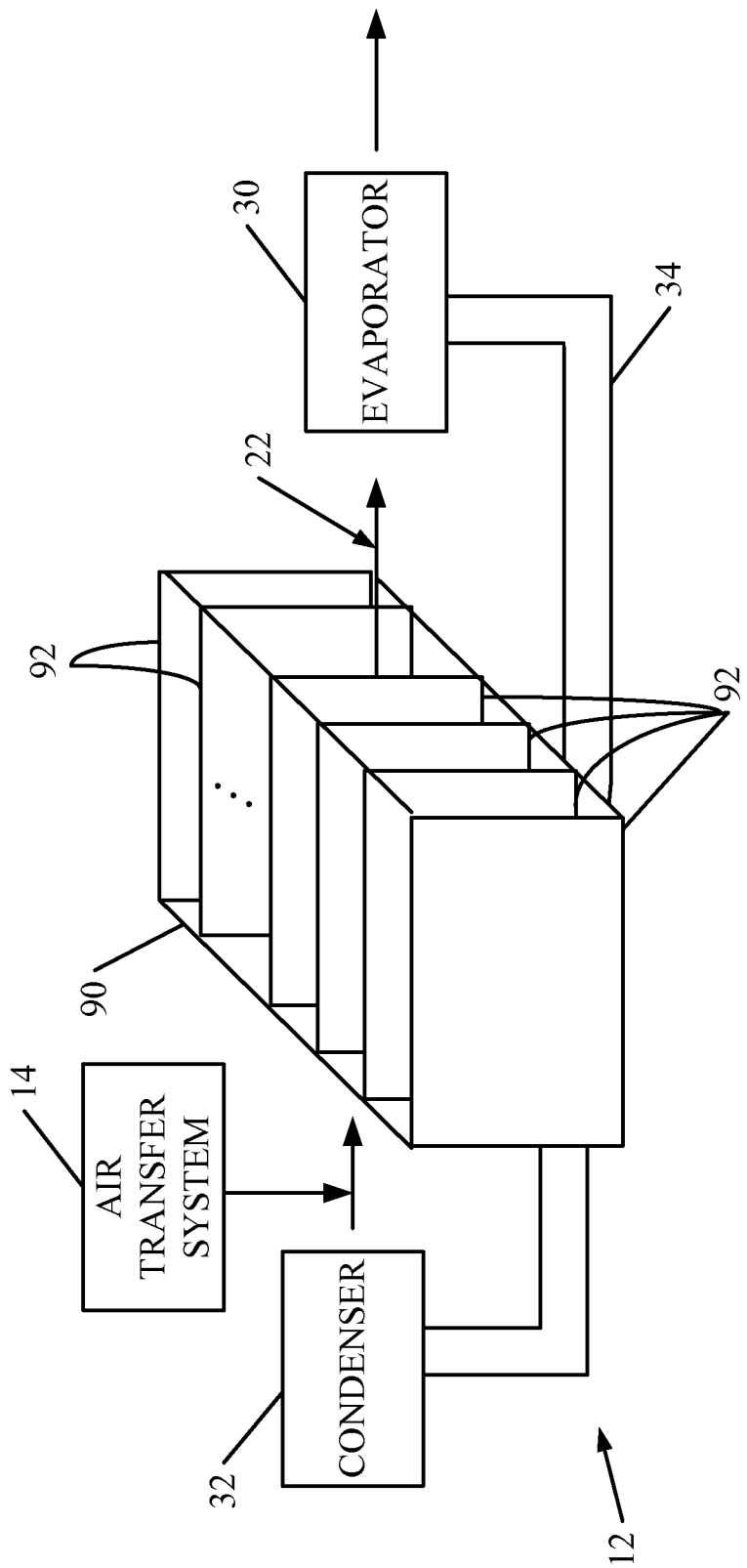
FIG. 9 shows an embodiment in which a liquid heat transfer system is deployed for cooling an entire rack of computing devices.

FIG. 9 shows an embodiment in which the liquid heat transfer system is deployed to preheat air that is used for cooling an entire rack of computers. FIG. 9 shows structural support such as a rack 90 that holds a plurality of computers 92, such as server computers. The server computers 92 are all cooled using an air transfer system 14 that transfers air along air travel path 22, through the rack 90 of server computers 92. In the embodiment shown in FIG. 9, evaporator 30 is shown at the outlet end of air travel path 22, after it travels through the rack 90 of server computers 92. System 12 transfers the heat gathered by evaporator 32 to condenser 34, at the inlet end of the air travel path 22, before the air passes through the rack of servers. Thus, in one embodiment, the invention can be applied to an entire rack of servers, to a relatively small data center (or container) that has a few thousand servers, or even to an entire data center, and not just on an individual server or container basis. Similarly, in another embodiment, multiple heat transfer systems 12 (or multiple parts thereof) can be used with a single server or a single set of components 16.

It should also be noted that the liquid heat transfer system can be a drop in component that is deployed within a computer. That is, liquid heat transfer system 12, for example, can be made separately from the computer that has components 16 and assembled into the case 80. Similarly, however, the liquid heat transfer system 12 can be designed integrally with the design of the computer that has components 16, by the computer manufacturer, so that physical characteristics of the system are designed to begin and end heat transfer in accordance with specifications of the computer manufacturer so components 16 stay within desired operating temperatures.

Figure 10:
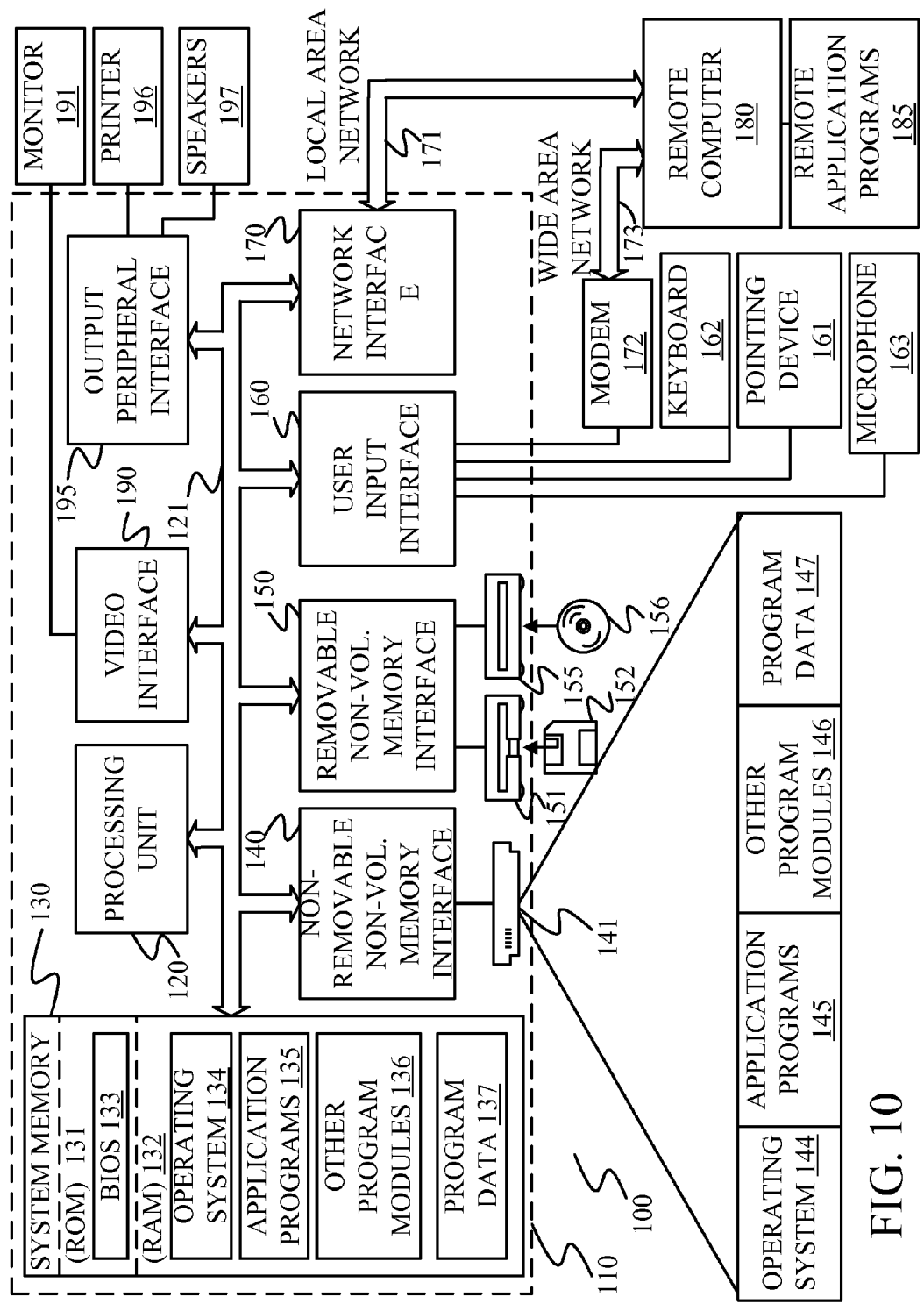
FIG. 10 illustrates one illustrative computing device that may be cooled.

FIG. 10 is one exemplary embodiment of a computing device 78. With reference to FIG. 10, an exemplary system for implementing some embodiments includes a general-purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically, but not always, includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 10 illustrates operating system 134, application programs 135, other program modules 636, and program data 137.

The computer 110 may also include other removable/non-removable volatile/nonvolatile computer storage media. By way of example only, FIG. 10 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 10, provide storage of computer readable instructions, data structures, program modules and other data for the computer 110. In FIG. 10, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies.

A user may enter commands and information into the computer 110 through input devices such as a keyboard 162, a microphone 163, and a pointing device 161, such as a mouse, trackball or touch pad. Other input devices (not shown) may include a joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195.

The computer 110 can be operated in a networked environment using logical connections to one or more remote computers, such as a remote computer 180. The remote computer 180 may be a personal computer, a hand-held device, a server, a router, a network PC, a peer device or other common network node, and typically includes many or all of the elements described above relative to the computer 110. The logical connections depicted in FIG. 10 include a local area network (LAN) 171 and a wide area network (WAN) 173, but may also include other networks. Such networking environments are commonplace in offices, enterprise-wide computer networks, intranets and the Internet. Computer 110 can be used in many different applications. For instance, by way of example, and without limitation, it can be used for general purpose computing, data communication applications, in avionics, military applications or electronics, or shipping electronics. Of course, computer 110, or portions thereof, can be used in many other applications as well.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 10 illustrates remote application programs 185 as residing on remote computer 180. It will be appreciated that the network connections shown are exemplary and other means of establishing a communications link between the computers may be used.

Components 16 can be any components in computer 110 that are to be cooled. Computer 110 may also act as one of the servers or server computers discussed with respect to FIG. 9. Also, it should be noted that many of the components shown in FIG. 10 can be fully implemented in silicon, or partially implemented in silicon. The particular configuration shown in FIG. 10 is exemplary only.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims

What is claimed is:

1. A system for cooling an electronic device, comprising:
   a ventilation system having an inlet section that receives inlet air that travels past one or more components of the electronic device to be cooled and an outlet section that outputs exhaust air after it has traveled past the one or more components to be cooled, to cool the one or more components to be cooled; and
   a liquid heat transfer system having a heat capture component located downstream of the one or more components to be cooled and configured to capture heat in the exhaust air generated by the one or more components and, wherein the liquid heat transfer system is configured to transfer the captured heat to a section of the electronic device upstream of the one or more components to be cooled.

2. The system of claim 1 wherein the liquid transfer system transfers the captured heat to the inlet section of the ventilation system to warm the inlet air before it travels past the one or more components to be cooled.

3. The system of claim 2 wherein the liquid heat transfer system is temperature controlled such that, as a temperature of the one or more components to be cooled reaches a threshold temperature, the liquid heat transfer system reduces an amount of heat transferred to the inlet section of the ventilation system.

4. The system of claim 3 wherein the liquid heat transfer system is a multi-phase liquid heat transfer system where liquid in the multi-phase liquid heat transfer system changes to gas during a portion of the transfer of the captured heat.

5. The system of claim 4 wherein the multi-phase liquid heat transfer system reaches dry-out, when all the liquid changes to gas, when the one or more components to be cooled reach the threshold temperature.

6. The system of claim 5 wherein the multi-phase liquid heat transfer system has a conduit connecting a condenser region that condenses the gas into liquid and an evaporator region that vaporizes the liquid into gas and wherein the temperature at which dry-out occurs is based in part on physical characteristics of the multi-phase liquid heat transfer system comprising a dimension of the evaporator section, physical dimensions of the conduit and a volume of the liquid, and wherein the physical characteristics are set so the temperature at which dry-out occurs corresponds to the threshold temperature of the one or more components to be cooled.

7. The system of claim 6 wherein the physical characteristics are set so the multi-phase liquid heat transfer system converts between a non-dry-out condition and a dry-out condition at a predetermined rate.

8. The system of claim 2 wherein the one or more components to be cooled comprises a set of electronic components enclosed in a housing and wherein the liquid heat transfer system is enclosed within the housing.

9. The system of claim 2 wherein the liquid heat transfer system has a first end disposed proximate the one or more components to be cooled and a second end disposed proximate the inlet section of the ventilation system.

10. The system of claim 9 wherein at least one of the first end and the second end of the liquid heat transfer system has surface area enhancing features that reduce thermal resistance of the liquid heat transfer system beyond a thermal resistance of the liquid heat transfer system without the surface area enhancing features.

11. A method of cooling a computing device, comprising:
transferring air from an inlet end of the computing device to an outlet end of the computing device, past one or more components to be cooled;
transferring heat from the one or more components to be cooled, using a liquid heat transfer system, to the inlet end of the computing device; and
releasing the heat transferred by the liquid heat transfer system at the inlet end to heat the air at the inlet end of the computing device, before the air passes the one or more components to be cooled, the liquid heat transfer system operating to reduce heat transferred by the liquid heat transfer system to heat the air at the inlet end when a temperature of the one or more components to be cooled reaches a predetermined threshold temperature.

12. The method of claim 11 wherein the liquid heat transfer system comprises a multi-phase liquid heat transfer system in which liquid changes to gas during transfer of heat and wherein the multi-phase liquid heat transfer system operates such that the liquid all changes to gas when the temperature of the one or more components to be cooled reaches the predetermined threshold temperature.

13. The method of claim 12 and further comprising:
controlling a rate at which the liquid all changes to gas when the temperature of the one or more components to be cooled reaches the threshold temperature.

14. The method of claim 13 wherein transferring air from the inlet end to the outlet end comprises:
moving the air between the inlet end and the outlet end with a fan, and wherein controlling the rate at which the liquid all changes to gas comprises controlling a speed of the fan.

15. An electronic computing device, comprising:
a structural support;
electronic computing components to be cooled, supported by the structural support;
an air transfer system, supported by the structural support and disposed to transfer air along an air transfer path from an air inlet end of the air transfer system, past one or more of the electronic computing components to be cooled, to an outlet end of the air transfer system, to carry heat from the one or more electronic computing components to be cooled to the outlet end of the air transfer system; and
a multi-phase liquid heat transfer system, supported by the structural support to transfer heat from the one or more electronic computing components to be cooled to a preheating area in the air transfer path upstream of the one or more electronic computing components to be cooled, the multi-phase liquid heat transfer system having liquid therein that changes to gas during transfer of heat, the liquid all changing to gas when the multi-phase liquid heat transfer system enters a dry-out condition that occurs when the multi-phase liquid heat transfer system reaches a dry-out temperature, the multi-phase liquid heat transfer system being arranged proximate the one or more electronic computing components to be cooled to enter the dry-out condition when the one or more electronic computing components to be cooled reach a predetermined threshold temperature, to reduce heat transferred to the preheating area when the one or more electronic computing components to be cooled reach the predetermined threshold temperature.

16. The electronic computing device of claim 15 wherein multi-phase liquid heat transfer system has physical characteristics including a size of a condenser region, a size of an evaporator region, a size of a conduit connecting the condenser region and the evaporator region, and a type of the liquid and a volume of the liquid, and wherein the physical characteristics of the multi-phase liquid heat transfer system are set so the dry-out temperature for the multi-phase liquid heat transfer system occurs when the one or more electronic computing components reach the predetermined threshold temperature.

17. The electronic computing device of claim 16 wherein the structural support comprises a case disposed about the electronic computing components, and wherein the multi-phase liquid heat transfer system is disposed within the case.

18. The electronic computing device of claim 16 wherein the one or more computing components to be cooled comprise a processing unit and wherein the multi-phase liquid heat transfer system has its evaporator region located adjacent the processing unit.

19. The electronic computing device of claim 16 wherein the multi-phase liquid heat transfer system has its evaporator region located at the outlet end of the air transfer system.

20. The electronic computing device of claim 16 wherein the electronic components to be cooled each comprise a server computer and wherein the structural support comprises a rack on which the server computers are supported.

* * * * *